(12) United States Patent
Li

(10) Patent No.: US 11,125,903 B2
(45) Date of Patent: Sep. 21, 2021

(54) NUCLEAR MAGNETIC RESONANCE SEQUENCE FOR PARTIALLY POLARIZED ECHO TRAINS

(71) Applicant: Halliburton Energy Services, Inc., Houston, TX (US)

(72) Inventor: Lilong Li, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 331 days.

(21) Appl. No.: 16/320,140

(22) PCT Filed: Jan. 3, 2018

(86) PCT No.: PCT/US2018/012256
§ 371 (c)(1),
(2) Date: Jan. 24, 2019

(87) PCT Pub. No.: WO2019/135746
PCT Pub. Date: Jul. 11, 2019

(65) Prior Publication Data
US 2021/0041593 A1   Feb. 11, 2021

(51) Int. Cl.
*G01V 3/32* (2006.01)
*G01N 24/08* (2006.01)
*G01R 33/561* (2006.01)

(52) U.S. Cl.
CPC .............. *G01V 3/32* (2013.01); *G01N 24/081* (2013.01); *G01R 33/5617* (2013.01)

(58) Field of Classification Search
CPC .............. G01R 33/448; G01R 33/3808; G01R 33/5617; G01V 3/32; G01N 24/081
See application file for complete search history.

(56) References Cited

U.S. PATENT DOCUMENTS

| 5,389,877 A | 2/1995 | Sezginer et al. |
| 6,049,205 A | 4/2000 | Taicher et al. |

(Continued)

FOREIGN PATENT DOCUMENTS

EP    0967490 A2   12/1999

OTHER PUBLICATIONS

PCT Application Serial No. PCT/US2018/012256, International Search Report, dated Sep. 28, 2018, 4 pages.

(Continued)

*Primary Examiner* — Rishi R Patel
(74) *Attorney, Agent, or Firm* — Gilliam IP PLLC

(57) ABSTRACT

A method and system for nuclear magnetic resonance (NMR) sequence for partially polarized echo trains is provided. An NMR pulse sequence is applied into a wellbore penetrating a subterranean formation using a NMR tool. The NMR pulse sequence includes a first cycle and a second cycle. The first cycle includes a first sequence of radio frequency (RF) pulses of a first duration and a first trainlet sequence of a second duration different from the first duration. The second cycle includes a second sequence of RF pulses of the first duration and a second trainlet sequence of the second duration. The second sequence of RF pulses forms a phase alternated pair with the first sequence of RF pulses. Echo signals corresponding to a substance in the subterranean formation are measured based on the NMR pulse sequence. A distribution of a characteristic of the substance is determined based on the echo signals.

20 Claims, 10 Drawing Sheets

(56) References Cited

U.S. PATENT DOCUMENTS

| | | | |
|---|---|---|---|
| 6,111,409 | A | 8/2000 | Edwards et al. |
| 6,570,381 | B1 | 5/2003 | Speier et al. |
| 6,624,629 | B1 * | 9/2003 | Speier ............... G01V 3/32 |
| | | | 324/303 |
| 6,972,564 | B2 | 12/2005 | Chen et al. |
| 7,501,818 | B2 | 3/2009 | Akkurt |
| 2003/0107374 | A1 * | 6/2003 | Chen ............... G01V 3/32 |
| | | | 324/303 |
| 2012/0235677 | A1 * | 9/2012 | Blanz ............ G01N 24/081 |
| | | | 324/303 |
| 2016/0054412 | A1 | 2/2016 | Ganssle et al. |

OTHER PUBLICATIONS

PCT Application Serial No. PCT/US2018/012256, International Written Opinion, dated Sep. 28, 2018, 12 pages.

\* cited by examiner

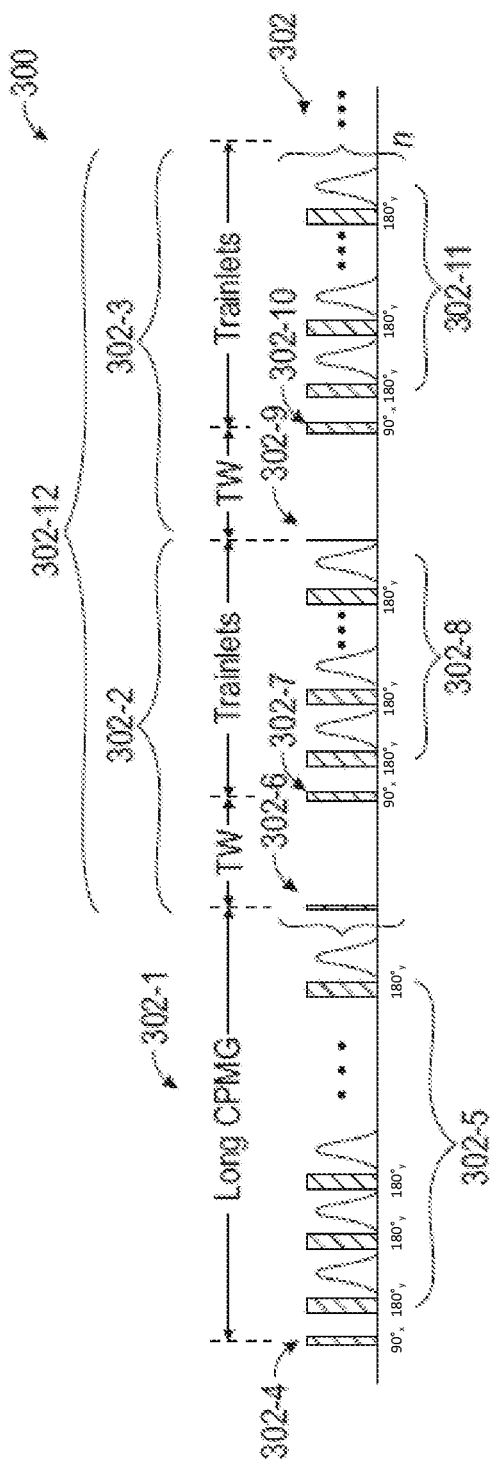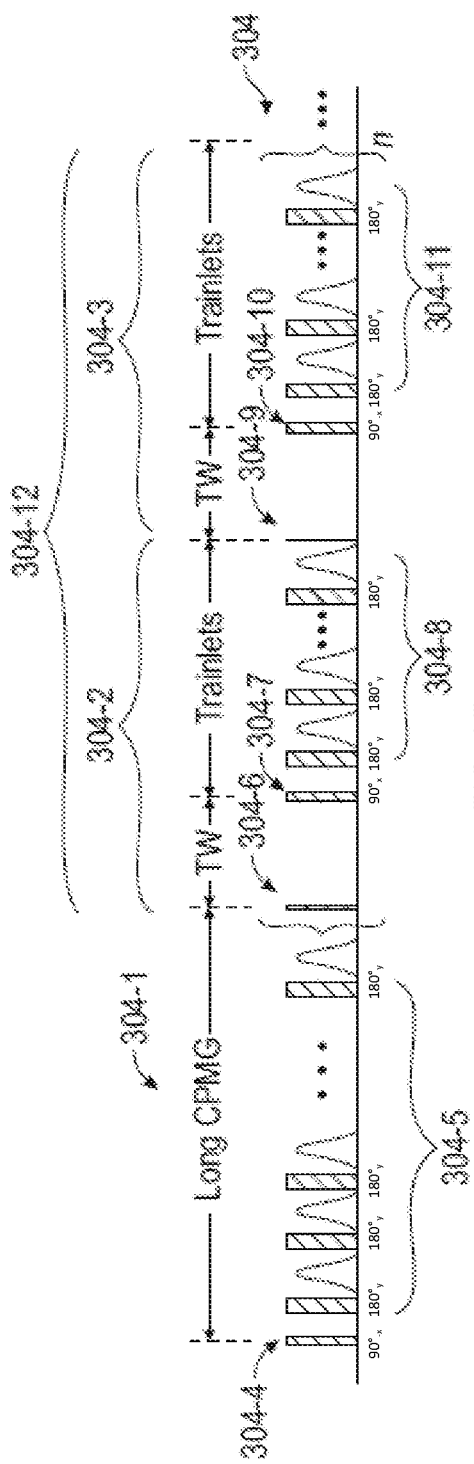
FIG. 3A
FIG. 3B

NUCLEAR MAGNETIC RESONANCE SEQUENCE FOR PARTIALLY POLARIZED ECHO TRAINS

TECHNICAL FIELD

The present description relates in general to downhole measurement systems, and more particularly to, for example, without limitation, nuclear magnetic resonance (NMR) sequence for partially polarized echo trains.

BACKGROUND

Understanding the structure and properties of geological formations can improve the efficiency of oil field operations such as drilling, well completion, and production. The collection of information relating to conditions downhole, commonly referred to as "logging," can be performed by several methods including nuclear magnetic resonance (NMR) logging.

Presently, NMR logging is considered to be one of the most effective techniques for determining geologic parameters. NMR technology has many advantages over other logging techniques (such as gamma ray logging, sonic logging, electric logging, and others), one of the most significant being the independence of NMR measurements from formation lithology. In particular, NMR data relates in a simple manner to formation pore sizes. This relationship facilitates detection of formation fluids (e.g., gas, oil, and water) independent of the matrix mineralogy. To this end, in addition to estimation of formation porosity, hydrocarbon saturation, and permeability, NMR logging enables computation of clay-bound water, capillary-bound water, and free fluid volumes, which aid in comprehensively evaluating the subterranean formation.

BRIEF DESCRIPTION OF THE DRAWINGS

FIGS. 3A-3C illustrate schematics of a pulse sequence for reducing amplitude error in accordance with one or more implementations.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

In some aspects, the amplitude of the first few partially recovered echo trains becomes distorted, especially in a case where the preceding fully recovered train is not long enough. In some aspects, the distortion is left uncorrected or the first few trainlets are simply discarded. Leaving the distortion uncorrected can make the inversion erroneous, especially in terms of T1 distribution. On the other hand, discarding the first few trainlets can be significantly costly.

The subject technology retains the first few trainlets and corrects for the amplitude error, thus making the NMR interpretation more accurate while at the same time not wasting time on NMR data acquisition. The subject technology provides for more accurate data acquisition of partially recovered echo trains (such as more accurate characterization of the amplitude of the partially recovered spin echoes), when such partial recoveries occur after when spins are inadequately saturated.

The subject disclosure provides for a NMR pulse sequence that in one cycle, executes an immediate phase alternated pair (PAP) of pulses for partially recovered spin echoes, while in a next cycle, executes a PAP for the rest of the sequence but retains the phase order of the excitation and refocusing pulses for at least one pair of partially recovered spin echoes, or alternatively, in the next cycle, executes a PAP for the rest of the sequence but changes the phase of the excitation and refocusing pulses by 180 degrees for at least one pair of partially recovered spin echoes.

Figure 1:
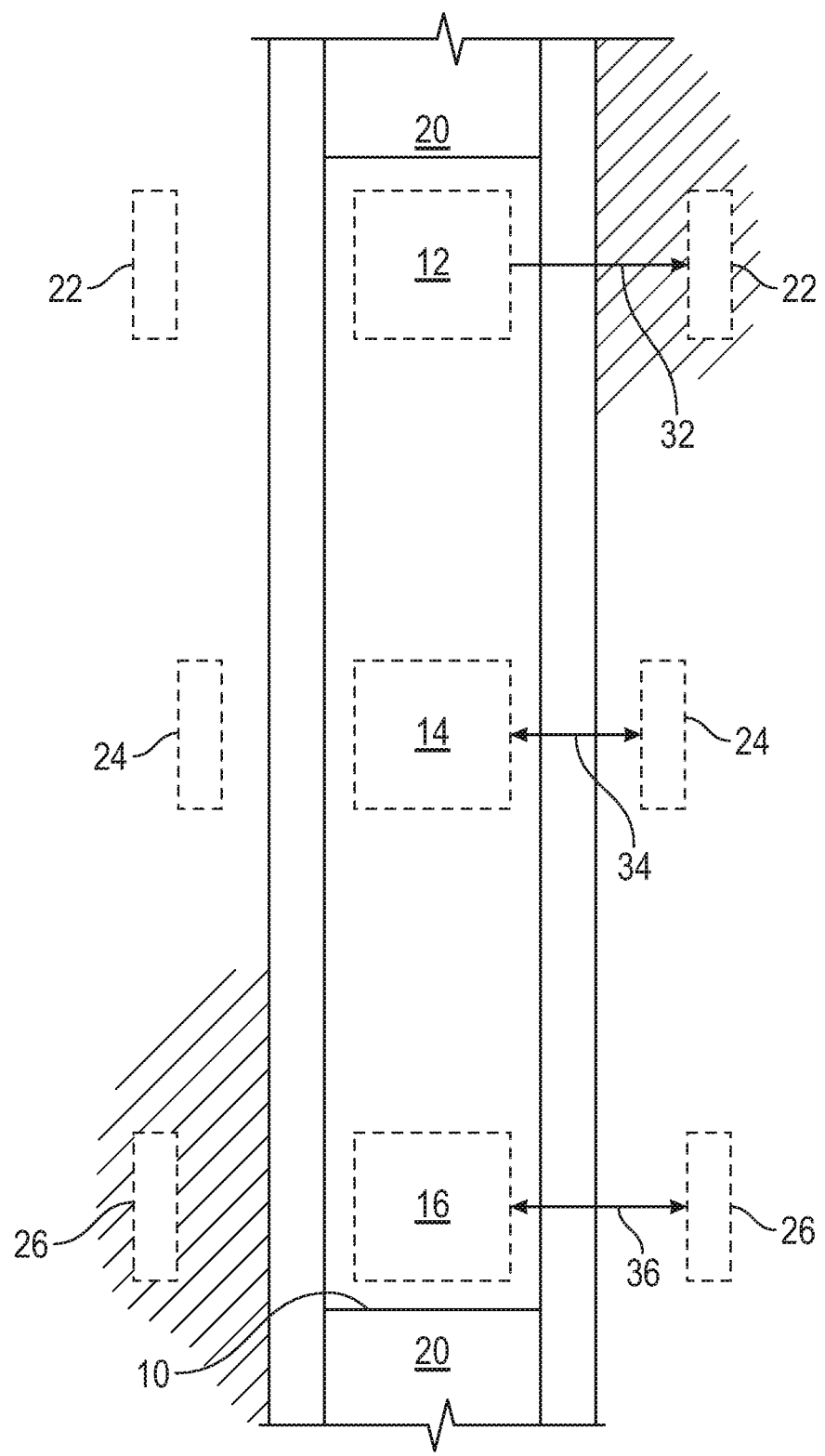
FIG. 1 illustrates a schematic of an example of a NMR tool deployed in a wellbore penetrating a subterranean formation in accordance with one or more implementations.

FIG. 1 illustrates a schematic of an example of a NMR tool 10 deployed in a wellbore penetrating a subterranean formation in accordance with one or more implementations. The NMR tool 10 measures sensitive volumes 22,24,26 at different depths into the subterranean formation 18. The NMR tool is arranged along a drill string 20 and includes three NMR radio frequency (RF) coils 12,14,16. Each NMR RF coil 12,14,16 is configured to measure corresponding sensitive volumes 22,24,26 at specified radial distances 32,34,36 from the NMR tool. As illustrated, two of the NMR RF coils 12,16 measure sensitive volumes 22,26 at the same radial distances 32,36 into the formation 18. Various NMR tool configurations can be used to measure the NMR properties of sensitive volumes at different depths into the formation. In one or more implementations, other known NMR tool configurations may be implemented to investigate the desired number of sensitive volumes. For example, field shaping may be used when the NMR tool includes a single NMR RF coil.

NMR tools of the type discussed above generally measure the time for hydrogen nuclei present in the earth formation to realign their spin axes, and consequently their bulk magnetization, either with an externally applied magnetic field, or perpendicularly to the magnetic field, after momentary reorientation due to the application of specific RF pulses. The externally applied magnetic field is typically provided by a magnet disposed in the tool. The spin axes of the hydrogen nuclei in the earth formation are, in the aggregate, caused to be aligned with the magnetic field induced in the earth formation by the magnet. The NMR tool includes an antenna positioned near the magnet and shaped so that a pulse of RF power conducted through the antenna induces a magnetic field in the earth formation orthogonal to the field induced by the magnet. The RF pulse has a duration predetermined so that the spin axes of the hydrogen nuclei generally align themselves perpendicular both to the orthogonal magnetic field induced by the RF pulse and to the externally applied magnetic field. After the pulse ends, the nuclear magnetic moment of the hydrogen nuclei gradually relax, i.e., return to their alignment with the externally applied magnetic field; at the same time an antenna, which is typically the same as the one used by the initial pulse, is electrically connected to a receiver, which detects and measures voltages induced in the antenna by precessional rotation of the spin axes of the hydrogen nuclei.

Nuclear magnetic resonance measurements are created by the oscillation of excited nuclear magnetic spins in the transverse plane, that is, the direction perpendicular to the magnetic field. This oscillation eventually dies out and the equilibrium magnetization returns. The return process is referred to as longitudinal relaxation. The time constant, T1, for nuclei to return to their equilibrium magnetization. Mo, is called the longitudinal relaxation time or the spin lattice relaxation time. The magnetization dephasing, that is losing coherence, along the transverse plane is given by the time constant T2 and is called the spin-spin relaxation time.

The primary objectives in NMR logging are measuring T1 signal amplitude (as a function of polarization), T2 signal amplitude and decay, and their distributions. The total signal amplitude is proportional to the total hydrogen content and is calibrated to give formation porosity independent of lithology effects. Both relaxation times can be interpreted for pore-size information and pore-fluid properties, especially viscosity.

T1 is generally measured by either of two pulse sequences: inversion recovery or saturation recovery. Inversion recovery consists of a 180° spin inversion followed by a variable recovery time and then a 90° read pulse. Saturation recovery uses a 90° pulse, followed by a 90° read pulse. T2 measurement uses the spin-echo technique, in which the protons are first tipped into the transverse (x-y) plane by a 90° RF pulse and then inverted (flipped) by a subsequent 180° RF pulse at a fixed-time interval to rephase the dephasing protons. Rephasing the protons creates a detectable signal called a spin echo. In operation, a sequence of pulses is used to generate a series of spin echoes (echo train) in which echo amplitude decreases exponentially with the time constant, T2.

A widely used NMR measurement technique, designed by Carr, Purcell, Meiboom, and Gill and, hence, referred to as CPMG, uses a sequence of radio frequency pulses to produce spin echoes and counteract dephasing of the magnetization in the medium investigated. In the CPMG pulse sequence, an initial pulse, commonly a 90° pulse, can be applied to tip the polarization into a plane perpendicular to the static magnetic field. To counter dephasing due to magnetic inhomogeneities, another pulse, a refocusing pulse, commonly a 180° or other angle tipping pulse, is applied to return to phase, which produces a signal called an echo from the medium. Successive 180° pulses are applied at a fixed-time interval (echo spacing, TE), and the echoes are recorded between the pulses. By recording an echo train, T2 can be calculated from the decay in the height (amplitude) of successive echoes.

However, non-formation signals—often referred to as "offset" or "ringing" signals—arise for a variety of reasons. For example, they may be caused by the high-sensitivity tool electronics (e.g., "offsets"), or may be due to magnetostrictive effects (e.g., "ringing") that arise from interactions between pulsed magnetic fields and electronic or magnetic components in the tool. For example, when RF pulses are applied to the antenna, the magnet can become physically deformed by magnetostriction. After each RF pulse is turned off, the magnet tends to return to its original shape in a series of damped mechanical oscillations, known as "ringing." Ringing induces voltages in the antenna, which can interfere with measurement of the voltages induced by the spin echoes. Typically, two pulse sequences of opposite phase are acquired to cancel electronic offsets and 180-degree ringing. The pair of pulse sequences is called a phase-alternated pair (PAP).

When recording multiple CPMG pulse sequences, the time period between spin-echo sequence and the next 90° CPMG excitation—during which the protons are repolarized by the static magnetic field—is called the wait time, TW. Each CPMG pulse sequence may use a different wait time, echo spacing, and number of echoes.

Figure 2:
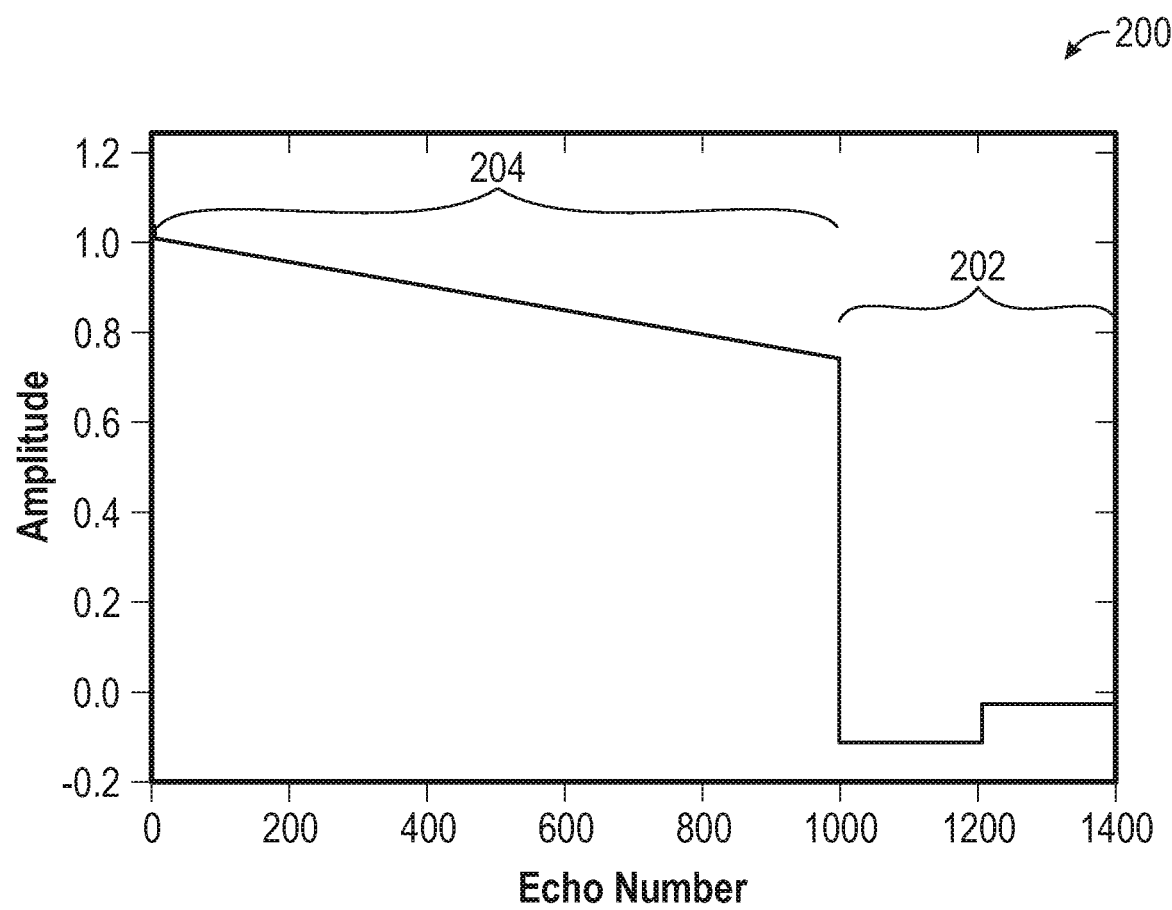
FIG. 2 illustrates a plot depicting an example of a spin dynamics simulation of trainlets in accordance with one or more implementations.

FIG. 2 illustrates a plot 200 depicting an example of a spin dynamics simulation of trainlets in accordance with one or more implementations. The plot 200 pictorially shows the simulation of two trainlets (e.g., 202), where each trainlet includes 200 echoes after a fully polarized long echo train of 1000 echoes (e.g., 204).

In some aspects, the spin dynamics simulation associated with the plot 200 can be performed with a pulse sequence that can be expressed as equation (1) as follows:

$$(TW_1\text{-spin echoes}_1)-(TW_2\text{-spin echoes}_2)_{+/-} - \ldots -(TW_n\text{-spin echoes}_n)_{+/-} \quad \text{Eq. (1)}$$

where n>2, and $TW_1$ through $TW_n$ are wait time values.

The spin echoes can be CPMG echo trains in some implementations, or any other echo trains in other implementations. The CPMG echo train may be a CPMG sequence that can be expressed as equation (2) as follows:

$$90°_x-\tau-(180°_y-\tau-\text{echo}-\tau)_{NE} \quad \text{Eq. (2)}$$

where +/− refers to a phase alternated pair, $\tau$ is about half TE (inter-echo spacing), $90°_x$ is the 90 degree pulse with phase in the x direction, $180°_y$ is the 180 degree pulse with phase in the y direction.

In some aspects, a theoretical CPMG amplitude can be expressed as equation (3) as follows:

$$Mo(1-e(TW/T1)) \quad \text{Eq. (3)}$$

The simulation parameters associated with element 202 in the plot 200 may be as follows: T1=T2=1 s; TW=105 ms; TE=0.3 ms. With the parameters used in the simulation, the expected trainlet amplitude is about [1−exp(−TW/T1)]=0.1, while the actual average amplitude for the two trainlets is about 0.03. Even though the amplitude may converge to the expected value, except for the steady state buildup when TW is relatively short, the abnormal behavior of the first few trainlets may render them useless. In the case for TWs on the order of 100 ms, there may only be time for the first few trainlets, so it is imperative that the amplitudes are produced correctly.

Figure 3C:
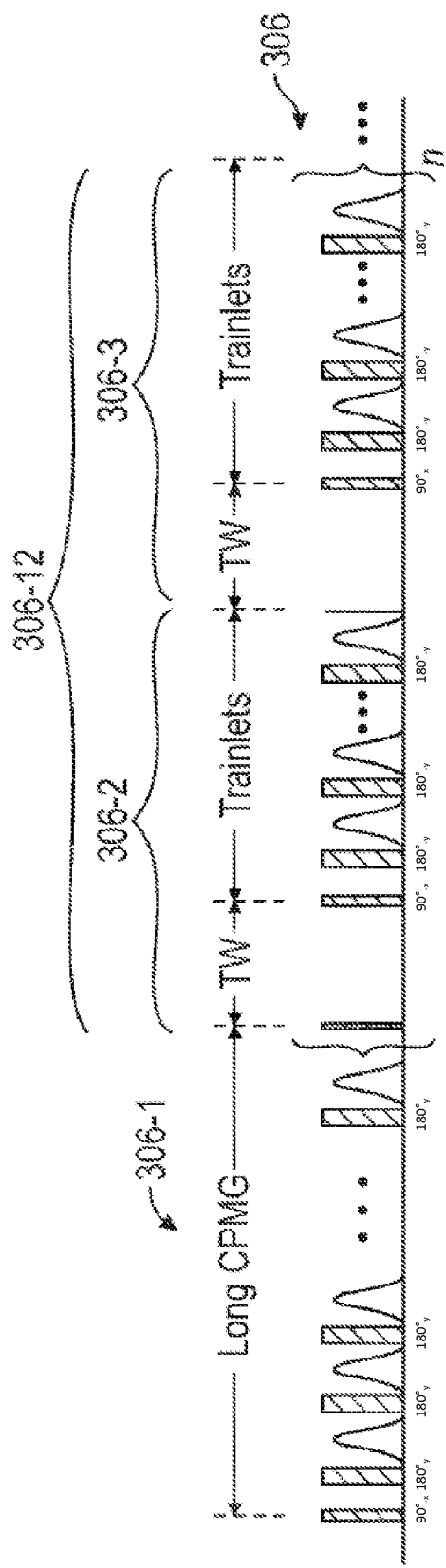

FIGS. 3A-3C illustrate schematics of a pulse sequence 300 in accordance with one or more implementations. In one or more implementations, the pulse sequence 300 reduces the amplitude error for the first subset of trainlets in a trainlet sequence, while at the same time preserves the PAP for the rest of CPMG echoes.

In FIG. 3A, the pulse sequence 300 includes a first cycle 302 (e.g., Cycle A) that generalizes the pulse sequence used in the simulation depicted in FIG. 2. The first cycle may include a fully polarized CPMG train 302-1, followed by a first trainlet sequence (e.g., 302-12) that includes two (2) trainlets (e.g., 302-2, 302-3) that are phase alternated, and the first trainlet sequence can be repeated N times (where N>=1). In some aspects, the trainlets (e.g., 302-2, 302-3) may be followed by other pulses such as other trainlets with different wait times. The trainlets (e.g., 302-2, 302-3) may be preceded by an optional saturation pulse in some implementations, or by multiple saturation pulses in other implementations. In FIG. 3B, the pulse sequence 300 also includes a second cycle 304 (e.g., Cycle B), which completes the phase alternation for the long CPMG echo train (e.g., 302-1), while preserving the exact phase sequence for the excitation and refocusing pulses of a second trainlet sequence (e.g., 304-12) having partial recovery trains that are acquired sequentially in phase alternated pairs (e.g., 304-2, 304-3). Similarly, the second trainlet sequence can be repeated N times. Alternatively, the pulse sequence 300 includes a different second cycle (e.g., Cycle B.) as depicted in FIG. 3C, which completes the phase alternation for the long CPMG echo train (e.g., 302-1), but changes the phase of the excitation and refocusing pulses of a third trainlet sequence (e.g., 306-12) by 180 degrees in the partial recovery trains (e.g., 306-2, 306-3). The third trainlet sequence also may be repeated N times. In some aspects, the alternative second cycle (e.g., 306) can be used in place of Cycle B (e.g., 304).

Figure 4:
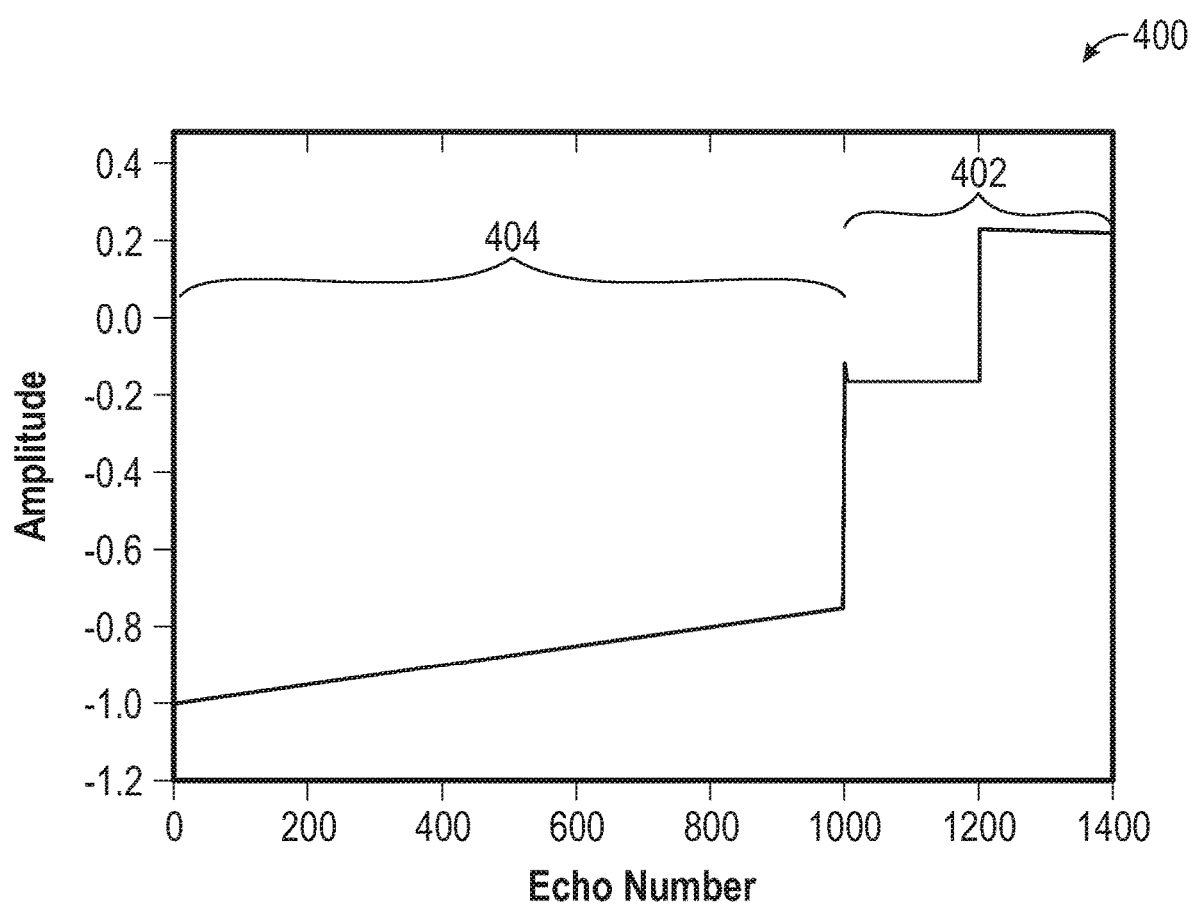
FIG. 4 illustrates a plot depicting an example of a trainlet simulation employing the pulse sequence in FIG. 3 in accordance with one or more implementations.

FIG. 4 illustrates a plot 400 depicting an example of a trainlet simulation employing the pulse sequence of FIG. 3 in accordance with one or more implementations. The plot 400 pictorially shows the simulation of two trainlets (e.g., 402), where each trainlet includes 200 echoes after a fully polarized long echo train of 1000 echoes (e.g., 404).

The plot 400 constitutes cycle B (e.g., 304) of the sequence in FIG. 3, while the plot 200 of FIG. 2 constitutes cycle A (e.g., 302). The simulation plots (e.g., 200, 400) show that while one cycle (e.g., 200) may overshoot the expected amplitude of the partial recoveries, the other cycle (e.g., 400) compensates and the average amplitude essentially matches the expected amplitude values.

Figure 5:
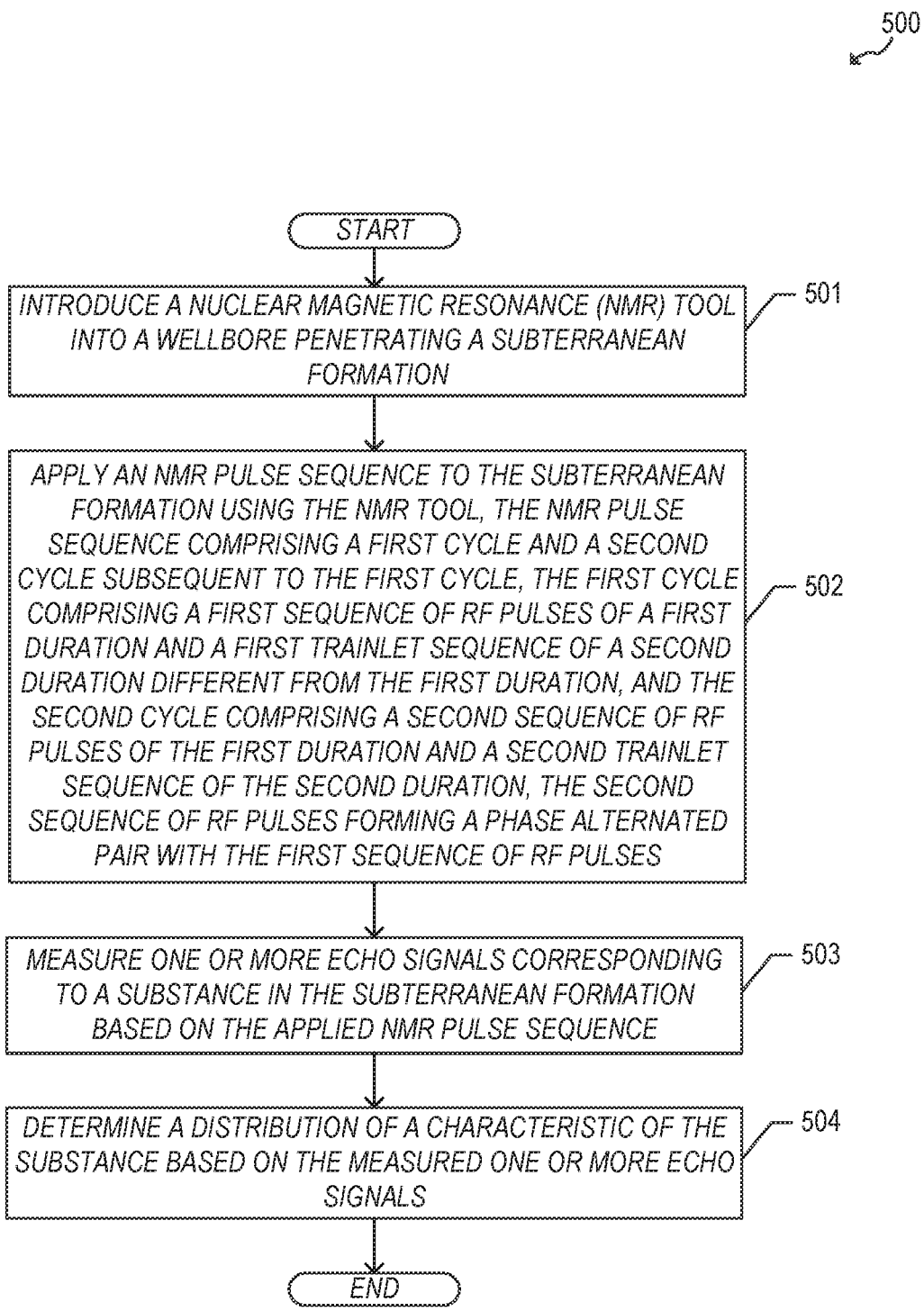
FIG. 5 illustrates a flowchart of an example process for a NMR sequence that reduces amplitude distortion in accordance with one or more implementations.

FIG. 5 illustrates a flowchart of an example process 500 for a NMR sequence that reduces amplitude distortion in accordance with one or more implementations. For explanatory purposes, the example process 500 is described herein with reference to the NMR pulse sequence 300 of FIG. 3 and the NMR logging system 608 that includes the logging tool 602 and the computing subsystem 610 of FIG. 6A; however, the example process 500 is not limited to the logging tool 602 and computing subsystem 610 of FIG. 6A, and one or more blocks of the example process 500 may be performed by one or more other components of the NMR logging system 608. Further for explanatory purposes, the blocks of the example process 500 are described herein as occurring in serial, or linearly. However, multiple blocks of the example process 500 may occur in parallel. In addition, the blocks of the example process 500 need not be performed in the order shown and/or one or more of the blocks of the example process 500 need not be performed.

Figure 6A:
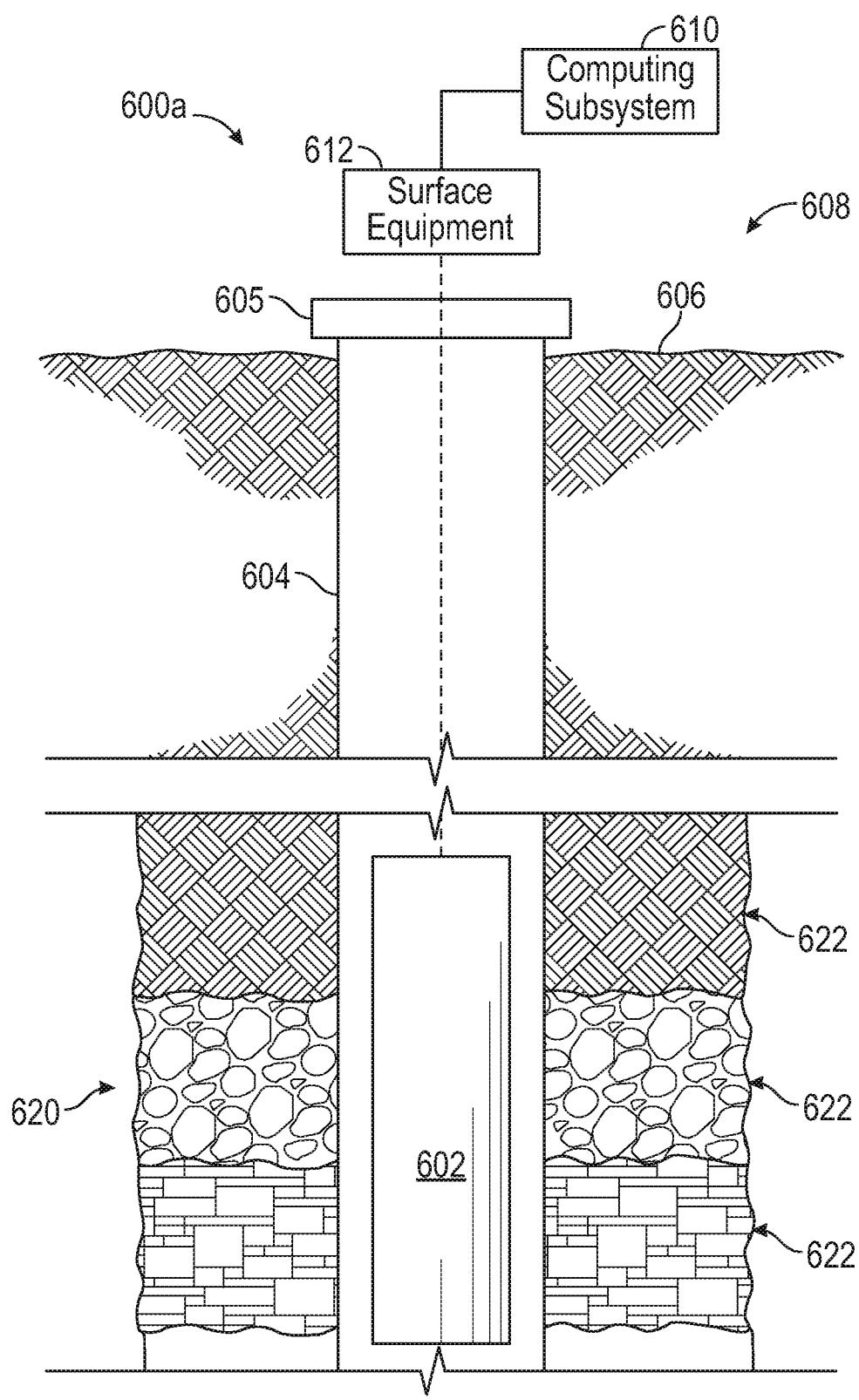
FIG. 6A illustrates a schematic view of a NMR logging operation deployed in and around a well system in accordance with one or more implementations.

The example process 500 begins, at step 501, where a nuclear magnetic resonance (NMR) tool, such as the logging tool 602 of FIG. 6A, is introduced into a wellbore penetrating a subterranean formation. At step 502, the logging tool 602 applies a nuclear magnetic resonance (NMR) pulse sequence (e.g., 300) into the wellbore penetrating the subterranean formation using the NMR tool. In one or more implementations, the NMR pulse sequence includes a first cycle (e.g., 302) and a second cycle (e.g., 304, 306) subsequent to the first cycle. In some aspects, the first cycle includes a first sequence of radio frequency (RF) pulses of a first duration and a first trainlet sequence of a second duration different from the first duration, and the second cycle includes a second sequence of RF pulses of the first duration and a second trainlet sequence of the second duration. In one or more implementations, the second sequence of RF pulses forms a phase alternated pair with the first sequence of RF pulses to complete the phase alternation for the long CPMG portion (e.g., 302-1). In some aspects, the first and second durations may be defined by the number of echoes. For example, the first duration may include about 1000 echoes and the second duration may include about 400 echoes. The number of echoes that make up the duration can be an arbitrary value without departing from the scope of the present disclosure. In some aspects, the first sequence of RF pulses has a first initial pulse (e.g., 302-4) and the second sequence of RF pulses has a second initial pulse (304-4), in which the first initial pulse and the second initial pulse have opposite phases. For example, the first initial pulse includes a 90° pulse and the second initial pulse includes a −90° pulse. Subsequently, at step 503, the logging tool 602 measures one or more echo signals corresponding to a substance in the subterranean formation based on the applied NMR pulse sequence. Next, at step 504, the logging tool 602 and the computing subsystem 610, individually and/or in combination, determine a distribution of a characteristic of the substance based on the measured one or more echo signals. In one or more implementations, the process 500 includes drilling the wellbore, and introducing the NMR tool into the wellbore. In some aspects, the NMR tool is either a wireline NMR tool or a logging while drilling (LWD) NMR tool.

In some implementations, each of the first sequence of RF pulses (e.g., 302-1) and the second sequence of RF pulses (e.g., 304-1) produces a long fully polarized echo train. In one or more implementations, each of the first sequence of RF pulses (e.g., 302-1) and the second sequence of RF pulses (e.g., 304-1) includes a Carr-Purcell-Meiboom-Gill (CPMG) sequence.

In applying the NMR pulse sequence (e.g., 300), the logging tool 602 applies the first sequence of RF pulses (e.g., 302-1) as part of the first cycle (e.g., 302). The logging tool 602 applies a first trainlet of pulses (e.g., 302-2) as part of the first trainlet sequence (e.g., 302-12), in which the first trainlet of pulses (e.g., 302-2) is subsequent to the first sequence of RF pulses (e.g., 302-1). The logging tool 602 also applies a second trainlet of pulses (e.g., 302-3) as part of the first trainlet sequence (e.g., 302-12), in which the second trainlet of pulses (e.g., 302-3) is subsequent to the first trainlet of pulses (e.g., 302-2). In some aspects, the first trainlet of pulses (e.g., 302-2) and the second trainlet of pulses (e.g., 302-3) have opposite phases.

In applying the NMR pulse sequence (e.g., 300), the logging tool 602 applies the second sequence of RF pulses (e.g., 304-1) as part of the second cycle (e.g., 304). The logging tool 602 applies a third trainlet of pulses (e.g., 304-2) as part of the second trainlet sequence (e.g., 304-12), in which the third trainlet of pulses (e.g., 304-2) is subsequent to the second sequence of RF pulses (e.g., 304-1). The logging tool 602 also applies a fourth trainlet of pulses (e.g., 304-3) as part of the second trainlet sequence (e.g., 304-12), in which the fourth trainlet of pulses (e.g., 304-3) is subsequent to the third trainlet of pulses (e.g., 304-2). In some aspects, the third trainlet of pulses (e.g., 304-2) and the fourth trainlet of pulses (e.g., 304-3) have opposite phases. In some aspects, the second sequence of RF pulses (e.g., 304-1) produces a greater number of echo signals than each of the third trainlet of pulses (e.g., 304-2) and the fourth trainlet of pulses (e.g., 304-3).

In some aspects, the first trainlet of pulses (e.g., 302-2) and the third trainlet of pulses (e.g., 304-2) have a common phase, and the second trainlet of pulses (e.g., 302-3) and the fourth trainlet of pulses (e.g., 304-3) have a common phase. In other aspects, the first trainlet of pulses (e.g., 302-2) and the third trainlet of pulses (e.g., 304-2) have opposite phases, and the second trainlet of pulses (e.g., 302-3) and the fourth trainlet of pulses (e.g., 304-3) have opposite phases.

In some aspects, the first sequence of RF pulses (e.g., 302-1) includes the first initial pulse (e.g., 302-4) and a first plurality of refocusing pulses (e.g., 302-5) subsequent to the first initial pulse, where each of the first plurality of refocusing pulses (e.g., 302-5) includes a 180° pulse with a phase orthogonal to that of the first initial pulse (e.g., 302-4).

In some implementations, the second sequence of RF pulses (e.g., 304-1) includes the second initial pulse (e.g., 304-4) and a second plurality of refocusing pulses (e.g., 304-5) subsequent to the second initial pulse. In some aspects, each of the second plurality of refocusing pulses (e.g., 304-5) includes a 180° pulse with a phase orthogonal to that of the second initial pulse (e.g., 304-4). In one or more implementations, the first plurality of refocusing pulses (e.g., 302-5) and the second plurality of refocusing pulses (e.g., 304-5) have a common phase.

In applying the first trainlet of pulses (e.g., 302-2), the logging tool 602 applies a first wait time (e.g., 302-6), and applies a first initial trainlet pulse (e.g., 302-7) subsequent to the first wait time. The logging tool 602 applies a first plurality of refocusing trainlet pulses (e.g., 302-8) subsequent to the first initial trainlet pulse (e.g., 302-7). In applying the second trainlet of pulses (e.g., 302-3), the logging tool 602 applies a second wait time (e.g., 302-9), and applies a second initial trainlet pulse (e.g., 302-10) subsequent to the second wait time. The logging tool 602 applies a second plurality of refocusing trainlet pulses (e.g., 302-11) subsequent to the second initial trainlet pulse (e.g., 302-10). In some aspects, the first initial trainlet pulse (e.g., 302-7) and the second initial trainlet pulse (e.g., 302-10) have opposite phases. In some implementations, the first plurality of refocusing trainlet pulses (e.g., 302-8) and the second plurality of refocusing trainlet pulses (e.g., 302-11) have a common phase.

In applying the third trainlet of pulses (e.g., 304-2), the logging tool 602 applies a third wait time (e.g., 304-6), and applies a third initial trainlet pulse (e.g., 304-7) subsequent to the third wait time. The logging tool 602 applies a third plurality of refocusing trainlet pulses (e.g., 304-8) subsequent to the third initial trainlet pulse (e.g., 304-7). In applying the fourth trainlet of pulses (e.g., 304-3), the logging tool 602 applies a fourth wait time (e.g., 304-9), and applies a fourth initial trainlet pulse (e.g., 304-10) subsequent to the fourth wait time. The logging tool 602 applies a fourth plurality of refocusing trainlet pulses (e.g., 304-11) subsequent to the fourth initial trainlet pulse (e.g., 304-10). In some aspects, the third initial trainlet pulse (e.g., 304-7) and the fourth initial trainlet pulse (e.g., 304-10) have opposite phases. In some implementations, the third plurality of refocusing trainlet pulses (e.g., 304-8) and the fourth plurality of refocusing trainlet pulses (e.g., 304-11) have a common phase.

In some aspects, the first initial trainlet pulse (e.g., 302-7) includes a 90° pulse and the third initial trainlet pulse (e.g., 304-7) includes a 90° pulse. In some implementations, each of the first plurality of refocusing trainlet pulses (e.g., 302-8) includes a 180° pulse with a phase orthogonal to that of the first initial trainlet pulse (e.g., 302-7), and each of the third plurality of refocusing trainlet pulses (e.g., 304-8) includes a 180° pulse with a phase orthogonal to that of the third initial trainlet pulse (e.g., 304-7).

In some aspects, the first initial trainlet pulse (e.g., 302-7) includes a 90 pulse and the third initial trainlet pulse (e.g., 304-7) includes a −90° pulse. In some implementations, each of the first plurality of refocusing trainlet pulses (e.g., 302-8) includes a 180° pulse with a phase orthogonal to that of the first initial trainlet pulse (e.g., 302-7), and each of the third plurality of refocusing trainlet pulses (e.g., 304-8) includes a −180° pulse with a phase orthogonal to that of the third initial trainlet pulse (e.g., 304-7).

In applying the NMR pulse sequence 300, the logging tool 602 applies a preparation pulse (not shown) subsequent to the second sequence of RF pulses (e.g., 304-1) and prior to the third trainlet of pulses (e.g., 304-2). In some aspects, the pulse sequence with the optional preparation pulse can be expressed as equation (4) as follows:

$$[(\text{prep}_1-TW_1-\text{spin echoes}_1)_{+/-}-(\text{prep}_2-TW_2-\text{spin echoes}_2)_{+/-}- \ldots -(\text{prep}_n-TW_n-\text{spin echoes}_n)_{+/-}]_m \qquad \text{Eq. (4)}$$

where the +/− denotes an immediate repetition of a pulse sequence but with the phase of one or more of the pulses in the preparation pulse sequence and/or the pulses in the spin echo trains switched by 180 degrees. In particular, such preparation pulses can be a saturation pulse, an inversion pulse, or hybrid saturation-inversion pulse, or any other preparation pulse without departing from the scope of the disclosure.

FIG. 6A depicts a schematic view of a NMR logging operation deployed in and around a well system 600a, according to one or more implementations. The well system 600a includes an NMR logging system 608 and a subterranean region 620 beneath the ground surface 606. The well system 600a can also include additional or different features that are not shown in FIG. 6A. For example, the well system 600a can include additional drilling system components, wireline logging system components, or other components.

The subterranean region 620 includes all or part of one or more subterranean formations or zones. The subterranean region 620 shown in FIG. 6A, for example, includes multiple subsurface layers 622. The subsurface layers 622 can include sedimentary layers, rock layers, sand layers, or any combination thereof and other types of subsurface layers. One or more of the subsurface layers can contain fluids, such as brine, oil, gas, or combinations thereof. A wellbore 604 penetrates through the subsurface layers 622. Although the wellbore 604 shown in FIG. 6A is a vertical wellbore, the NMR logging system 608 can also be implemented in other wellbore orientations. For example, the NMR logging system 608 may be adapted for horizontal wellbores, slant wellbores, curved wellbores, vertical wellbores, or any combination thereof.

The NMR logging system 608 also includes a logging tool 602, surface equipment 612, and a computing subsystem 610. In the shown in FIG. 6A, the logging tool 602 is a downhole logging tool that operates while disposed in the wellbore 604. The surface equipment 612 shown in FIG. 6A operates at or above the surface 606, for example, near the well head 605, to control the logging tool 602 and possibly other downhole equipment or other components of the well system 600a. The computing subsystem 610 receives and analyzes logging data from the logging tool 602. An NMR logging system can include additional or different features, and the features of an NMR logging system can be arranged and operated as represented in FIG. 6A or in another manner.

All or part of the computing subsystem 610 can be implemented as a component of, or integrated with one or more components of, the surface equipment 612, the logging tool 602, or both. For example, the computing subsystem 610 can be implemented as one or more computing structures separate from but communicative with the surface equipment 612 and the logging tool 602.

The computing subsystem 610 can be embedded in the logging tool 602 (not shown), and the computing subsystem 610 and the logging tool 602 operate concurrently while disposed in the wellbore 604. For example, although the computing subsystem 610 is shown above the surface 606 in FIG. 6A, all or part of the computing subsystem 610 may reside below the surface 606, for example, at or near the location of the logging tool 602.

The well system 600a includes communication or telemetry equipment that allows communication among the computing subsystem 610, the logging tool 602, and other components of the NMR logging system 608. For example, each of the components of the NMR logging system 608 can include one or more transceivers or similar apparatus for wired or wireless data communication among the various components. The NMR logging system 608 can include, but is not limited to, one or more systems and/or apparatus for wireline telemetry, wired pipe telemetry, mud pulse telemetry, acoustic telemetry, electromagnetic telemetry, or any combination of these and other types of telemetry. In some embodiments, the logging tool 602 receives commands, status signals, or other types of information from the computing subsystem 610 or another source. The computing subsystem 610 can also receive logging data, status signals, or other types of information from the logging tool 602 or another source.

NMR logging operations are performed in connection with various types of downhole operations at various stages in the lifetime of a well system and therefore structural attributes and components of the surface equipment 612 and logging tool 602 are adapted for various types of NMR logging operations. For example, NMR logging may be performed during drilling operations, during wireline logging operations, or in other contexts. As such, the surface equipment 612 and the logging tool 602 can include or operate in connection with drilling equipment, wireline logging equipment, or other equipment for other types of operations.

Figure 6B:
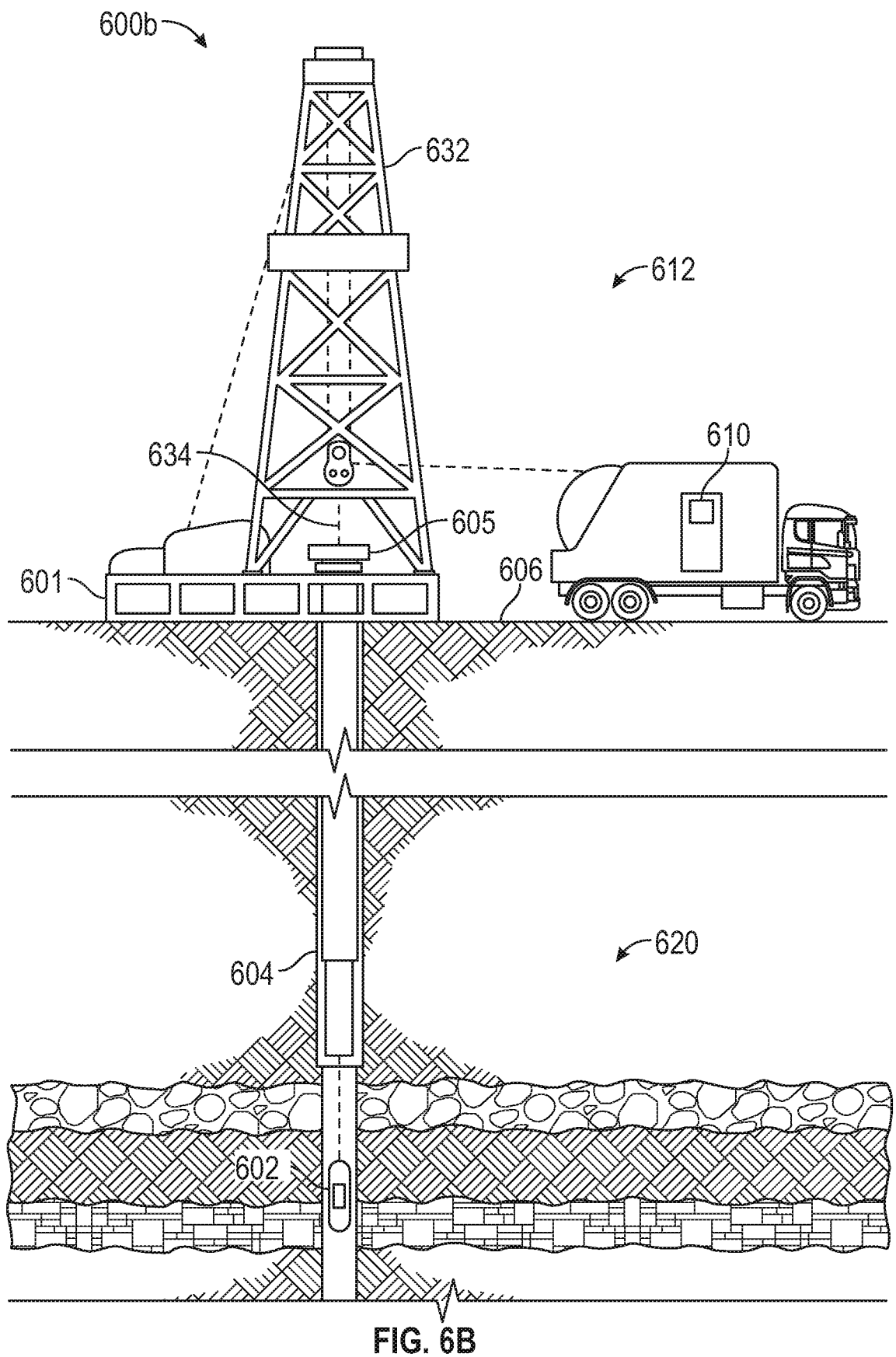
FIG. 6B illustrates a schematic view of a wireline NMR logging operation deployed in and around a well system in accordance with one or more implementations.

FIG. 6B depicts a schematic view of a wireline NMR logging operation deployed in and around a well system 600b, according to one or more implementations. The well system 600b includes the NMR logging tool 602 in a wireline logging environment. The surface equipment 612 includes, but is not limited to, a platform 601 disposed above the surface 606 equipped with a derrick 632 that supports a wireline cable 634 extending into the wellbore 604. Wireline logging operations are performed, for example, after a drill string is removed from the wellbore 604, to allow the wireline logging tool 602 to be lowered by wireline or logging cable into the wellbore 604.

Figure 6C:
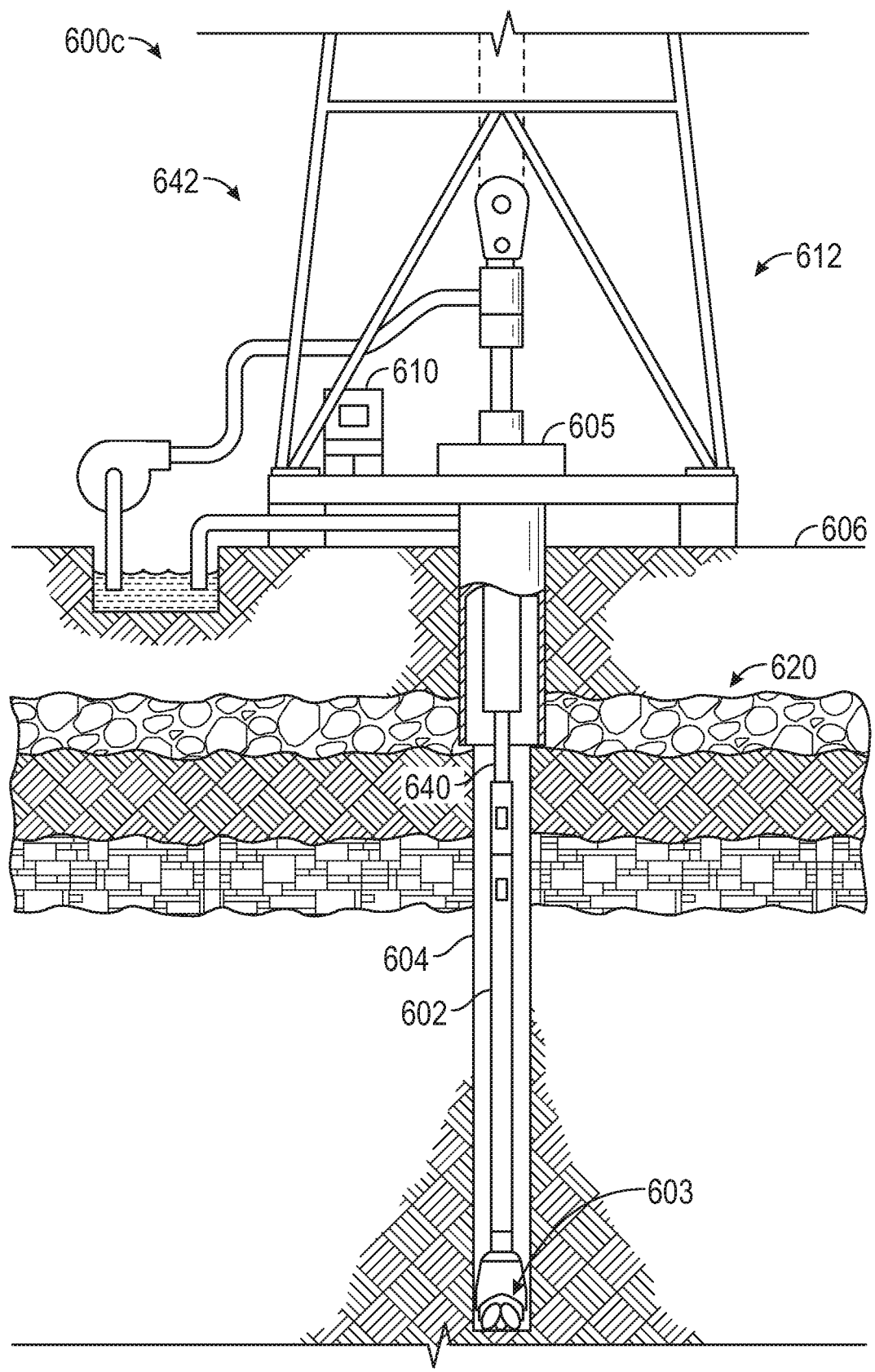
FIG. 6C illustrates a schematic view of a well system that includes the NMR logging tool in a logging while drilling (LWD) environment in accordance with one or more implementations.

FIG. 6C depicts a schematic view of a well system 600c that includes the NMR logging tool 602 performing a logging operation (e.g., logging-while-drilling (LWD) measurements), according to one or more implementations. It should be noted that while FIG. 6C generally depicts a land-based drilling assembly, those skilled in the art will readily recognize that the principles described herein are equally applicable to subsea drilling operations that employ floating or sea-based platforms and rigs, without departing from the scope of the disclosure.

NMR logging operations is performed during drilling operations. Drilling is performed using a string of drill pipes connected together to form a drill string 640 that is lowered through a rotary table into the wellbore 604. A drilling rig 642 at the surface 606 supports the drill string 640, as the drill string 640 is operated to drill a wellbore penetrating the subterranean region 620. The drill string 640 can include, for example, but is not limited to, a kelly, a drill pipe, a bottom hole assembly, and other components. The bottomhole assembly on the drill string can include drill collars, drill bits, the logging tool 602, and other components. Exemplary logging tools can be or include, but are not limited to, measuring while drilling (MWD) tools and LWD tools.

The logging tool 602 includes an NMR tool for obtaining NMR measurements from the subterranean region 620. As shown, for example, in FIG. 6B, the logging tool 602 is suspended in the wellbore 604 by a coiled tubing, wireline cable, or another structure or conveyance that connects the tool to a surface control unit or other components of the surface equipment 612.

The logging tool 602 is lowered to the bottom of a region of interest and subsequently pulled upward (e.g., at a substantially constant speed) through the region of interest. As shown, for example, in FIG. 6C, the logging tool 602 is deployed in the wellbore 604 on jointed drill pipe, hard wired drill pipe, or other deployment hardware. In other example implementations, the logging tool 602 collects data during drilling operations as it moves downward through the region of interest. The logging tool 602 may also collect data while the drill string 640 is moving, for example, while the logging tool 602 is being tripped in or tripped out of the wellbore 604.

The logging tool 602 may also collect data at discrete logging points in the wellbore 604. For example, the logging tool 602 moves upward or downward incrementally to each logging point at a series of depths in the wellbore 604. At each logging point, instruments in the logging tool 602 perform measurements on the subterranean region 620. The logging tool 602 also obtains measurements while the logging tool 602 is moving (e.g., being raised or lowered). The measurement data is communicated to the computing subsystem 610 for storage, processing, and analysis. Such data may be gathered and analyzed during drilling operations (e.g., LWD operations), during wireline logging operations, other conveyance operations, or during other types of activities.

The computing subsystem 610 receives and analyzes the measurement data from the logging tool 602 to detect properties of various subsurface layers 622. For example, the computing subsystem 610 can identify the density, material content, and/or other properties of the subsurface layers 622 based on the NMR measurements acquired by the logging tool 602 in the wellbore 604.

The logging tool 602 obtains NMR signals by polarizing nuclear spins in the formation 620 and pulsing the nuclei with a radio frequency (RF) magnetic field. Various pulse sequences (i.e., series of radio frequency pulses, delays, and other operations) are used to obtain NMR signals, including the Carr Purcell Meiboom Gill (CPMG) sequence (in which the spins are first tipped using a tipping pulse followed by a series of refocusing pulses), a saturation recovery pulse sequence, and other pulse sequences.

Figure 7:
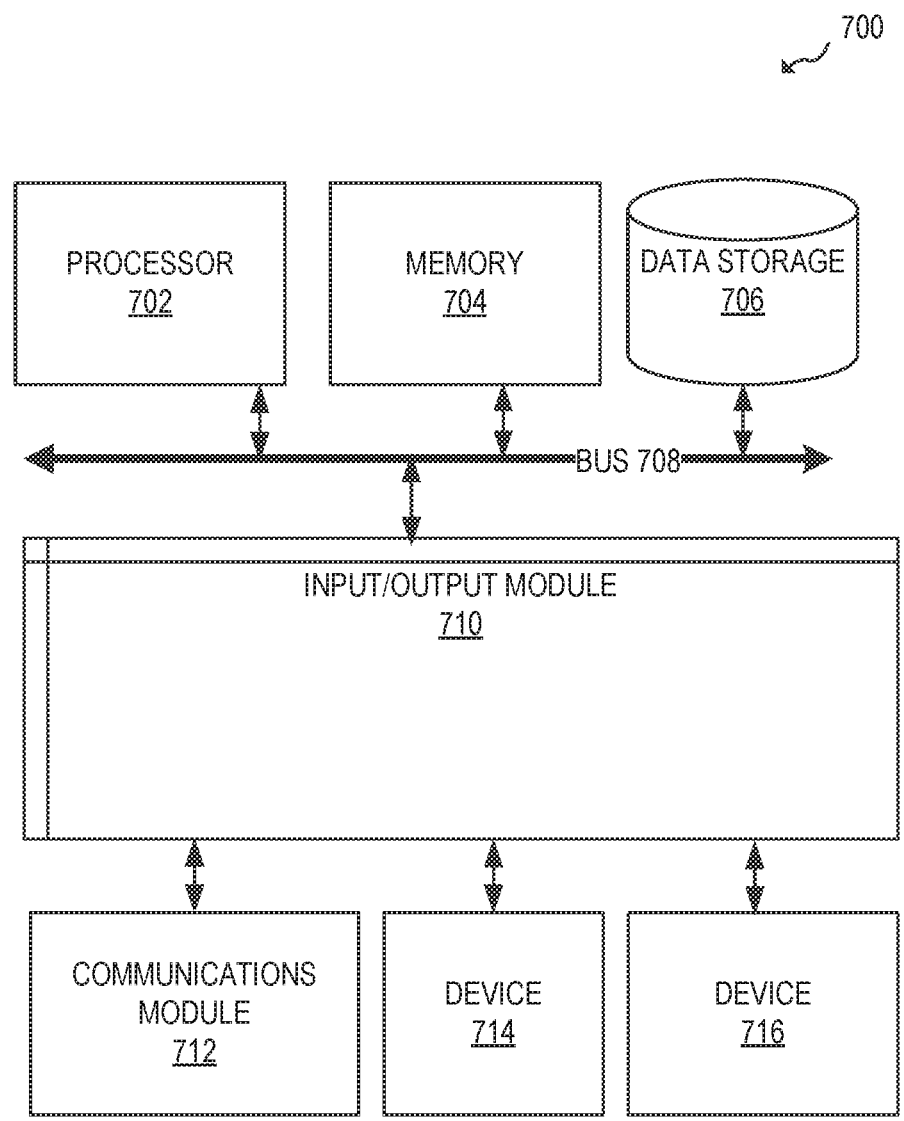
FIG. 7 is a block diagram illustrating an example computer system with which the computing subsystem of FIG. 6A can be implemented.

FIG. 7 is a block diagram illustrating an exemplary computer system 700 with which the computing subsystem 610 of FIG. 6A can be implemented. In certain aspects, the computer system 700 may be implemented using hardware or a combination of software and hardware, either in a dedicated server, integrated into another entity, or distributed across multiple entities.

Computer system 700 (e.g., computing subsystem 610) includes a bus 708 or other communication mechanism for communicating information, and a processor 702 coupled with bus 708 for processing information. By way of example, the computer system 700 may be implemented with one or more processors 702. Processor 702 may be a general-purpose microprocessor, a microcontroller, a Digital Signal Processor (DSP), an Application Specific Integrated Circuit (ASIC), a Field Programmable Gate Array (FPGA), a Programmable Logic Device (PLD), a controller, a state machine, gated logic, discrete hardware components, or any other suitable entity that can perform calculations or other manipulations of information.

Computer system 700 can include, in addition to hardware, code that creates an execution environment for the computer program in question, e.g., code that constitutes processor firmware, a protocol stack, a database management system, an operating system, or a combination of one or more of them stored in an included memory 704, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 708 for storing information and instructions to be executed by processor 702. The processor 702 and the memory 704 can be supplemented by, or incorporated in, special purpose logic circuitry.

The instructions may be stored in the memory 704 and implemented in one or more computer program products, i.e., one or more modules of computer program instructions encoded on a computer readable medium for execution by, or to control the operation of, the computer system 700, and according to any method well known to those of skill in the art, including, but not limited to, computer languages such as data-oriented languages (e.g., SQL, dBase), system languages (e.g., C, Objective-C, C++, Assembly), architectural languages (e.g., Java, .NET), and application languages (e.g., PHP, Ruby, Perl, Python). Instructions may also be implemented in computer languages such as array languages, aspect-oriented languages, assembly languages, authoring languages, command line interface languages, compiled languages, concurrent languages, curly-bracket languages, dataflow languages, data-structured languages, declarative languages, esoteric languages, extension languages, fourth-generation languages, functional languages, interactive mode languages, interpreted languages, iterative languages, list-based languages, little languages, logic-based languages, machine languages, macro languages, metaprogramming languages, multiparadigm languages, numerical analysis, non-English-based languages, object-oriented class-based languages, object-oriented prototype-based languages, off-side rule languages, procedural languages, reflective languages, rule-based languages, scripting languages, stack-based languages, synchronous languages, syntax handling languages, visual languages, wirth languages, and xml-based languages. Memory 704 may also be used for storing temporary variable or other intermediate information during execution of instructions to be executed by processor 702.

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 700 further includes a data storage device 706 such as a magnetic disk or optical disk, coupled to bus 708 for storing information and instructions. Computer system 700 may be coupled via input/output module 710 to various devices. The input/output module 710 can be any input/output module. Exemplary input/output modules 710 include data ports such as USB ports. The input/output module 710 is configured to connect to a communications module 712. Exemplary communications modules 712 include networking interface cards, such as Ethernet cards and modems. In certain aspects, the input/output module 710 is configured to connect to a plurality of devices, such as an input device 714 and/or an output device 716. Exemplary input devices 714 include a keyboard and a pointing device, e.g., a mouse or a trackball, by which a user can provide input to the computer system 700. Other kinds of input devices 714 can be used to provide for interaction with a user as well, such as a tactile input device, visual input device, audio input device, or brain-computer interface device. For example, feedback provided to the user can be any form of sensory feedback. e.g., visual feedback, auditory feedback, or tactile feedback, and input from the user can be received in any form, including acoustic, speech, tactile, or brain wave input. Exemplary output devices 716 include display devices such as a LCD (liquid crystal display) monitor, for displaying information to the user.

According to one aspect of the present disclosure, the computing subsystem 610 can be implemented using a computer system 700 in response to processor 702 executing one or more sequences of one or more instructions contained in memory 704. Such instructions may be read into memory 704 from another machine-readable medium, such as data storage device 706. Execution of the sequences of instructions contained in the main memory 704 causes processor 702 to perform the process steps described herein. One or more processors in a multi-processing arrangement may also be employed to execute the sequences of instructions contained in the memory 704. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component. e.g., such as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. The communication network can include, for example, any one or more of a LAN, a WAN, the Internet, and the like. Further, the communication network can include, but is not limited to, for example, any one or more of the following network topologies, including a bus network, a star network, a ring network, a mesh network, a star-bus network, tree or hierarchical network, or the like. The communications modules can be, for example, modems or Ethernet cards.

Computer system 700 can include clients and servers. A client and server are generally remote from each other and typically interact through a communication network. The relationship of client and server arises by virtue of computer programs running on the respective computers and having a client-server relationship to each other. Computer system 700 can be, for example, and without limitation, a desktop computer, laptop computer, or tablet computer. Computer system 700 can also be embedded in another device, for example, and without limitation, a mobile telephone such as a smartphone.

The term "machine-readable storage medium" or "computer readable medium" as used herein refers to any medium or media that participates in providing instructions to processor 702 for execution. Such a medium may take many forms, including, but not limited to, non-volatile media, volatile media, and transmission media. Non-volatile media include, for example, optical or magnetic disks, such as data storage device 706. Volatile media include dynamic memory, such as memory 704. Transmission media include coaxial cables, copper wire, and fiber optics, including the wires that comprise bus 708. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, or any other medium from which a computer can read. The machine-readable storage medium can be a machine-readable storage device, a machine-readable storage substrate, a memory device, a composition of matter effecting a machine-readable propagated signal, or a combination of one or more of them.

Various examples of aspects of the disclosure are described below. These are provided as examples, and do not limit the subject technology.

The method includes applying a nuclear magnetic resonance (NMR) pulse sequence into a wellbore penetrating a subterranean formation using a NMR tool, in which the NMR pulse sequence includes a first cycle and a second cycle subsequent to the first cycle. In some aspects, the first cycle includes a first sequence of radio frequency (RF) pulses and the second cycle includes a second sequence of RF pulses. In some aspects, the first sequence of RF pulses has a first initial pulse and the second sequence of RF pulses has a second initial pulse, in which the first initial pulse and the second initial pulse have opposite phases. The method also includes measuring one or more echo signals corresponding to a substance in the subterranean formation based on the applied NMR pulse sequence, and determining a distribution of a characteristic of the substance based on the measured one or more echo signals.

In some implementations, each of the first sequence of RF pulses and the second sequence of RF pulses produces a long fully polarized echo train. In one or more implementations, each of the first sequence of RF pulses and the second sequence of RF pulses includes a Carr-Purcell-Meiboom-Gill (CPMG) sequence.

In some aspects, the first initial pulse includes a 90° pulse and the second initial pulse includes a −90° pulse.

In applying the NMR pulse sequence, the method includes applying the first sequence of RF pulses as part of the first cycle, applying a first trainlet of pulses as part of the first cycle, the first trainlet of pulses being subsequent to the first sequence of RF pulses, and applying a second trainlet of pulses as part of the first cycle, the second trainlet of pulses being subsequent to the first trainlet of pulses. In some aspects, the first trainlet of pulses and the second trainlet of pulses have opposite phases.

In applying the NMR pulse sequence, the method includes applying the second sequence of RF pulses as part of the second cycle, applying a third trainlet of pulses as part of the second cycle, the third trainlet of pulses being subsequent to the second sequence of RF pulses, and applying a fourth trainlet of pulses as part of the second cycle, the fourth trainlet of pulses being subsequent to the third trainlet of pulses. In some aspects, the third trainlet of pulses and the fourth trainlet of pulses have opposite phases.

In some aspects, the first trainlet of pulses and the third trainlet of pulses have a common phase, and the second trainlet of pulses and the fourth trainlet of pulses have a common phase. In other aspects, the first trainlet of pulses and the third trainlet of pulses have opposite phases, and the second trainlet of pulses and the fourth trainlet of pulses have opposite phases.

In some aspects, the first sequence of RF pulses includes the first initial pulse and a first plurality of recovery pulses subsequent to the first initial pulse, and each of the first plurality of recovery pulses comprises a 180° pulse with a phase orthogonal to that of the first initial pulse.

In some implementations, the second sequence of RF pulses includes the second initial pulse and a second plurality of recovery pulses subsequent to the second initial pulse. In some aspects, each of the second plurality of recovery pulses comprises a 180 pulse with a phase orthogonal to that of the second initial pulse, and the first plurality of recovery pulses and the second plurality of recovery pulses have a common phase.

In applying the first trainlet of pulses, the method includes applying a first wait time, applying a first initial trainlet pulse subsequent to the first wait time, and applying a first plurality of refocusing trainlet pulses subsequent to the first initial trainlet pulse. In applying the second trainlet of pulses, the method includes applying a second wait time, applying a second initial trainlet pulse subsequent to the second wait time, and applying a second plurality of recovery trainlet pulses subsequent to the second initial trainlet pulse. In some aspects, the first initial trainlet pulse and the second initial trainlet pulse have opposite phases, and the first plurality of recovery trainlet pulses and the second plurality of refocusing trainlet pulses have a common phase.

In applying the third trainlet of pulses, the method includes applying a third wait time, applying a third initial trainlet pulse subsequent to the third wait time, and applying a third plurality of refocusing trainlet pulses subsequent to the third initial trainlet pulse. In applying the fourth trainlet of pulses, the method includes applying a fourth wait time, applying a fourth initial trainlet pulse subsequent to the fourth wait time, and applying a fourth plurality of recovery trainlet pulses subsequent to the fourth initial trainlet pulse. In some aspects, the third initial trainlet pulse and the fourth initial trainlet pulse have opposite phases, and the third plurality of refocusing trainlet pulses and the fourth plurality of recovery trainlet pulses have a common phase.

In some aspects, the first initial trainlet pulse includes a 90° pulse and the third initial trainlet pulse includes a 90° pulse. In some implementations, each of the first plurality of refocusing trainlet pulses includes a 180° pulse with a phase orthogonal to that of the first initial trainlet pulse, and each of the third plurality of refocusing trainlet pulses includes a 180° pulse with a phase orthogonal to that of the third initial trainlet pulse.

In some aspects, the first initial trainlet pulse includes a 90° pulse and the third initial trainlet pulse includes a −90° pulse. In some implementations, each of the first plurality of refocusing trainlet pulses includes a 180° pulse with a phase orthogonal to that of the first initial trainlet pulse, and each of the third plurality of refocusing trainlet pulses includes a −180° pulse with a phase orthogonal to that of the third initial trainlet pulse.

In some aspects, the second sequence of RF pulses produces a greater number of echo signals than each of the third trainlet of pulses and the fourth trainlet of pulses.

In applying the NMR pulse sequence, the method includes applying a preparation pulse subsequent to the second sequence of RF pulses and prior to the third trainlet of pulses. In some aspects, the preparation pulse comprises one or more saturation pulses, one or more inversion pulses, or one or more hybrid saturation-inversion pulses.

The method also includes drilling the wellbore, and introducing the NMR tool and a formation testing tool into the wellbore. In some aspects, the NMR tool is either a wireline NMR tool or a logging while drilling (LWD) NMR tool.

A system includes a nuclear magnetic resonance (NMR) tool, a formation testing tool, a processing unit, and a memory communicably coupled to the NMR tool and to the formation testing tool. In one or more implementations, the memory stores instructions that, when executed by the processing unit, cause the processing unit to apply a nuclear magnetic resonance (NMR) pulse sequence into a wellbore penetrating a subterranean formation using a NMR tool, measure one or more echo signals corresponding to a substance in the subterranean formation based on the applied NMR pulse sequence, and determine a distribution of a characteristic of the substance based on the measured one or more echo signals. In some implementations, the NMR pulse sequence includes a first cycle and a second cycle subsequent to the first cycle. In some aspects, the first cycle includes a first sequence of radio frequency (RF) pulses and a first phase alternated pair of RF pulses, and the second cycle includes a second sequence of RF pulses and a second phase alternated pair of RF pulses. In some aspects, the first sequence of RF pulses has a first initial pulse and the second sequence of RF pulses has a second initial pulse, in which the first initial pulse and the second initial pulse have opposite phases.

In one or more aspects, examples of clauses are described below.

A method comprising one or more methods, operations or portions thereof described herein.

An apparatus comprising one or more memories and one or more processors (e.g., 700), the one or more processors configured to cause performing one or more methods, operations or portions thereof described herein.

An apparatus comprising one or more memories (e.g., 704, one or more internal, external or remote memories, or one or more registers) and one or more processors (e.g., 702) coupled to the one or more memories, the one or more processors configured to cause the apparatus to perform one or more methods, operations or portions thereof described herein.

An apparatus comprising means (e.g., 700) adapted for performing one or more methods, operations or portions thereof described herein.

A processor (e.g., 702) comprising modules for carrying out one or more methods, operations or portions thereof described herein.

A hardware apparatus comprising circuits (e.g., 700) configured to perform one or more methods, operations or portions thereof described herein.

An apparatus comprising means (e.g., 700) adapted for performing one or more methods, operations or portions thereof described herein.

An apparatus comprising components (e.g., 700) operable to carry out one or more methods, operations or portions thereof described herein.

A computer-readable storage medium (e.g., 704, one or more internal, external or remote memories, or one or more registers) comprising instructions stored therein, the instructions comprising code for performing one or more methods or operations described herein.

A computer-readable storage medium (e.g., 704, one or more internal, external or remote memories, or one or more registers) storing instructions that, when executed by one or more processors, cause one or more processors to perform one or more methods, operations or portions thereof described herein.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the subject technology. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims.

Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

Therefore, the subject technology is well adapted to attain the ends and advantages mentioned as well as those that are inherent therein. The particular embodiments disclosed above are illustrative only, as the subject technology may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the subject technology. The subject technology illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b." or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

What is claimed is:

1. A method comprising:
   applying a nuclear magnetic resonance (NMR) pulse sequence into a wellbore penetrating a subterranean formation using a NMR tool, the NMR pulse sequence comprising a first cycle and a second cycle subsequent to the first cycle, the first cycle comprising a first sequence of radio frequency (RF) pulses and a first trainlet sequence, wherein the first trainlet sequence is applied following a partially recovered spin echo train of the first sequence of RF pulses, the second cycle comprising a second sequence of RF pulses and a second trainlet sequence, wherein the second sequence of RF pulses forms a phase alternated pair with the first sequence of RF pulses and wherein the second trainlet sequence is applied following a fully recovered echo train of the second sequence of RF pulses;
   measuring one or more echo signals generated by the applied NMR pulse sequence; and
   determining a property of the subterranean formation based, at least in part, on the measured one or more echo signals.

2. The method of claim 1, wherein each of the first sequence of RF pulses and the second sequence of RF pulses produces a long fully polarized echo train, and wherein each of the first sequence of RF pulses and the second sequence of RF pulses comprises a Carr-Purcell-Meiboom-Gill (CPMG) sequence.

3. The method of claim 1, wherein applying the NMR pulse sequence comprises:
   applying a first trainlet of pulses as part of the first trainlet sequence; and
   applying a second trainlet of pulses as part of the first trainlet sequence,
   wherein the first trainlet of pulses and the second trainlet of pulses have opposite phases.

4. The method of claim 3, wherein applying the NMR pulse sequence comprises:
   applying a third trainlet of pulses as part of the second trainlet sequence; and
   applying a fourth trainlet of pulses as part of the second trainlet sequence,
   wherein the third trainlet of pulses and the fourth trainlet of pulses have opposite phases.

5. The method of claim 4, wherein the first trainlet of pulses and the third trainlet of pulses have a common phase, and wherein the second trainlet of pulses and the fourth trainlet of pulses have a common phase.

6. The method of claim 4, wherein the first trainlet of pulses and the third trainlet of pulses have opposite phases, and wherein the second trainlet of pulses and the fourth trainlet of pulses have opposite phases.

7. The method of claim 4, wherein the first sequence of RF pulses comprises a first initial pulse and a first plurality of refocusing pulses subsequent to the first initial pulse, wherein each of the first plurality of refocusing pulses is a 180° pulse with a phase orthogonal to that of the first initial pulse.

8. The method of claim 7, wherein the second sequence of RF pulses comprises a second initial pulse and a second plurality of refocusing pulses subsequent to the second initial pulse, wherein each of the second plurality of refocusing pulses is a 180° pulse with a phase orthogonal to that of the second initial pulse, and wherein the first plurality of refocusing pulses and the second plurality of refocusing pulses have a common phase.

9. The method of claim 8, wherein the first initial pulse is a 90° pulse and the second initial pulse is a −90° pulse.

10. The method of claim 4, wherein:
    applying the first trainlet of pulses comprises:
      applying a first initial trainlet pulse subsequent to a first wait time; and
      applying a first plurality of refocusing trainlet pulses subsequent to the first initial trainlet pulse, and
    applying the second trainlet of pulses comprises:
      applying a second initial trainlet pulse subsequent to a second wait time; and
      applying a second plurality of refocusing trainlet pulses subsequent to the second initial trainlet pulse, the first initial trainlet pulse and the second initial trainlet pulse having opposite phases, the first plurality of refocusing trainlet pulses and the second plurality of refocusing trainlet pulses having a common phase.

11. The method of claim 10, wherein:
    applying the third trainlet of pulses comprises:
      applying a third initial trainlet pulse subsequent to a third wait time; and
      applying a third plurality of refocusing trainlet pulses subsequent to the third initial trainlet pulse, and
    applying the fourth trainlet of pulses comprises:
      applying a fourth initial trainlet pulse subsequent to a fourth wait time; and
      applying a fourth plurality of refocusing trainlet pulses subsequent to the fourth initial trainlet pulse, the third initial trainlet pulse and the fourth initial trainlet pulse having opposite phases, the third plurality of refocusing trainlet pulses and the fourth plurality of refocusing trainlet pulses having a common phase.

12. The method of claim 11, wherein the first initial trainlet pulse and the third initial trainlet pulse are 90° pulses.

13. The method of claim 12, wherein each of the first plurality of refocusing trainlet pulses is a 180° pulse with a phase orthogonal to that of the first initial trainlet pulse, and wherein each of the third plurality of refocusing trainlet pulses is a 180° pulse with a phase orthogonal to that of the third initial trainlet pulse.

14. The method of claim 11, wherein the first initial trainlet pulse is a 90° pulse and the third initial trainlet pulse is a −90° pulse.

15. The method of claim 14, wherein each of the first plurality of refocusing trainlet pulses is a 180° pulse with a phase orthogonal to that of the first initial trainlet pulse, and wherein each of the third plurality of refocusing trainlet pulses is a −180° pulse with a phase orthogonal to that of the third initial trainlet pulse.

16. The method of claim 4, wherein the second sequence of RF pulses comprises a greater number of pulses than each of the third trainlet of pulses and the fourth trainlet of pulses.

17. The method of claim 4, wherein applying the NMR pulse sequence comprises:
    applying one or more preparation pulses subsequent to the second sequence of RF pulses and prior to the third trainlet of pulses, wherein the one or more preparation pulses comprises one or more saturation pulses, one or more inversion pulses, or one or more hybrid saturation-inversion pulses.

18. The method of claim 1, further comprising:
    introducing the NMR tool and a formation testing tool into the wellbore, wherein the NMR tool is a logging while drilling (LWD) NMR tool.

19. A system comprising:
a nuclear magnetic resonance (NMR) tool;
a processing unit; and
a memory communicably coupled to the NMR tool, wherein the memory stores instructions that, when executed by the processing unit, cause the system to:
apply a nuclear magnetic resonance (NMR) pulse sequence into a wellbore penetrating a subterranean formation using the NMR tool, the NMR pulse sequence comprising a first cycle and a second cycle subsequent to the first cycle, the first cycle comprising a first sequence of radio frequency (RF) pulses and a first trainlet sequence, wherein the first trainlet sequence is applied following a partially recovered spin echo train of the first sequence of RF pulses, the second cycle comprising a second sequence of RF pulses and a second trainlet sequence, wherein the second sequence of RF pulses forms a phase alternated pair with the first sequence of RF pulses and wherein the second trainlet sequence is applied following a fully recovered spin echo train of the second sequence of RF pulses;
measure one or more echo signals corresponding to the applied NMR pulse sequence; and
determine a distribution of a characteristic of a substance in the subterranean formation based on the measured one or more echo signals.

20. The system of claim 19, wherein the memory further has stored thereon instructions executable by the processing unit, to cause the system to:
determine an average trainlet amplitude based on a first and second set of echo signals of the measured one or more echo signals corresponding to the applied NMR pulse sequence, wherein the first set of echo signals corresponds to the first trainlet sequence and the second set of echo signals corresponds to the second trainlet sequence; and
determine a total signal amplitude based, at least in part, on the average trainlet amplitude, wherein the distribution of the characteristic of the substance in the subterranean formation is also based on the total signal amplitude.

* * * * *